(12) United States Patent
Vashchenko et al.

(10) Patent No.: US 7,023,029 B1
(45) Date of Patent: Apr. 4, 2006

(54) COMPLEMENTARY VERTICAL SCRS FOR SOI AND TRIPLE WELL PROCESSES

(75) Inventors: Vladislav Vashchenko, Palo Alto, CA (US); Ann Concannon, San Jose, CA (US); Peter J. Hopper, San Jose, CA (US); Marcel ter Beek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/210,943

(22) Filed: Aug. 2, 2002

(51) Int. Cl.
 H01L 29/72 (2006.01)
(52) U.S. Cl. .................. 257/173; 257/197; 257/355
(58) Field of Classification Search ............... 257/126, 257/173, 197, 355–356, 361–362, 370, 378, 257/676
 See application file for complete search history.

(56) References Cited

U.S. PATENT DOCUMENTS

| | | | | |
|---|---|---|---|---|
| 5,473,169 A | * | 12/1995 | Ker et al. | 257/173 |
| 5,747,834 A | * | 5/1998 | Chen et al. | 257/111 |
| 5,751,054 A | * | 5/1998 | Yilmaz et al. | 257/603 |
| 5,966,599 A | * | 10/1999 | Walker et al. | 438/228 |
| 6,225,181 B1 | * | 5/2001 | Gregory | 438/355 |
| 6,236,087 B1 | * | 5/2001 | Daly et al. | 257/355 |
| 6,396,137 B1 | * | 5/2002 | Klughart | 257/691 |
| 2002/0135046 A1 | * | 9/2002 | Yu | 257/579 |

FOREIGN PATENT DOCUMENTS

FR 2775831 A1 * 9/1999

OTHER PUBLICATIONS

Delage et al, IEEEJournal of Solid-State Circuits, vol. 34, No. 9, Sep. 1999, pp. 1283-1289.*

* cited by examiner

Primary Examiner—Minhloan Tran
Assistant Examiner—Johannes Mondt
(74) Attorney, Agent, or Firm—Jurgen Vollrath

(57) ABSTRACT

In an ESD protection device using a SCR-like structure, a vertical device is provided that is highly robust and easily allows the triggering voltage to be adjusted during manufacture. Furthermore it is implementable in complementary form based on PNP and NPN BJT structures, to provide both positive and negative pulse protection.

6 Claims, 3 Drawing Sheets

COMPLEMENTARY VERTICAL SCRS FOR SOI AND TRIPLE WELL PROCESSES

FIELD OF THE INVENTION

The invention relates to SCR-type ESD protection structures. More particularly, it relates to SCR-type ESD protection structures suitable for implementation using SOI or triple well processes.

BACKGROUND OF THE INVENTION

Analog circuits typically display sensitivity to excessive voltage levels. Transients, such as electrostatic discharges (ESD) can cause the voltage handling capabilities of the analog circuit to be exceeded, resulting in damage to the analog circuit. Clamps have been devised to shunt current to ground during excessive voltage peaks.

Different clamps have been developed, each with different characteristics. For instance, one type of protection clamp employs avalanche diodes such as zener diodes to provide the bias voltage for the base of a subsequent power bipolar junction transistor (BJT). Another type makes use of grounded gate NMOS devices (GGNMOS). However, GGNMOS devices are not only large, consuming a lot of space on a chip, they also suffer from the disadvantage that they support only limited current densities. The protection capability of an ESD protection device can be defined as the required contact width of the structure required to protect against an ESD pulse amplitude, or, stated another way, as the maximum protected ESD pulse amplitude for a given contact width. Thus, the smaller the contact width for a given ESD pulse amplitude protection, the better.

Furthermore process considerations are important when deciding on the type of ESD device to implement. It is clearly desirable to make use of existing process steps as much as possible and avoid having to introduce new process steps. One type of ESD protection solution that is highly efficient and is commonly used in BiCMOS, BCD, SOI, and triple well CMOS technology, is the silicon-controlled rectifier (SCR). In fact, in the case of SOI and triple well process, SCRs currently provide the only ESD solution due to severe process design rule limitations in these two processes. As discussed below, SCRs are essentially lateral structures in which carriers cross laterally over substantially vertically extending junctions. Another defining characteristic of SCRs which make them highly desirable as ESD protection devices is their double injection characteristic which provides for high current densities.

A silicon-controlled rectifier (SCR), such as the one illustrated in FIG. 1, can be seen as a device that provides an open circuit between a first node and a second node when the voltage across the first and second nodes is positive and less than a trigger voltage. When the voltage across the first and second nodes rises to be equal to or greater than the trigger voltage, the SCR provides a low-resistance current path between the first and second nodes. Further, once the low-resistance current path has been provided, the SCR maintains the current path as long as the voltage across the first and second nodes is equal to or greater than a holding voltage that is lower than the trigger voltage. As a result of these characteristics, SCRs have been used to provide ESD protection. When used for ESD protection, the first node becomes a to-be-protected node, and the second node is typically connected to ground. The SCR operates within an ESD protection window that has a maximum voltage defined by the destructive breakdown level of the to-be-protected node, and a minimum voltage (also known as a latch-up voltage) defined by any dc bias on the to-be-protected node.

Thus, when the voltage across the to-be-protected node and the second node is less than the trigger voltage, the SCR provides an open circuit between the to-be-protected node and the second node. However, when the to-be-protected node receives a voltage spike that equals or exceeds the trigger voltage, such as when an ungrounded human-body discharge occurs, the SCR provides a low-resistance current path from the to-be-protected node to the second node. In addition, once the ESD event has passed and the voltage on the to-be-protected node falls below the holding voltage, the SCR again provides an open circuit between the to-be-protected node and the second node.

FIG. 1 shows a cross-sectional view that illustrates a conventional SCR 100. As shown in FIG. 1, SCR 100 has a n-well 112 which is formed in a p-type semiconductor material 110, such as a substrate or a well, and a n+ region 114 and a p+ region 116 which are formed in n-well 112. The n+ and p+ regions 114 and 116 are both connected to a to-be-protected node 120. As further shown in FIG. 1, SCR 100 also has a n+ region 122 and a p+ region 124 formed in semiconductor material 110. The n+ and p+ regions 122 and 124 are both connected to an output node 126.

In operation, when the voltage across nodes 120 and 126 is positive and less than the trigger voltage, the voltage reverse biases the junction between n-well 112 and p-type material 110. The reverse-biased junction, in turn, blocks charge carriers from flowing from node 120 to node 126. However, when the voltage across nodes 120 and 126 is positive and equal to or greater than the trigger voltage, the reverse-biased junction breaks down due to avalanche multiplication.

The breakdown of the junction causes a large number of holes to be injected into material 110, and a large number of electrons to be injected into n-well 112. The increased number of holes increases the potential of material 110 in the region that lies adjacent to n+ region 122, and eventually forward biases the junction between material 110 and n+ region 122.

When the increased potential forward biases the junction, a npn transistor that utilizes n+ region 122 as the emitter, p-type material 110 as the base, and n-well 112 as the collector turns on. When turned on, n+ (emitter) region 122 injects electrons into (base) material 110. Most of the injected electrons diffuse through (base) material 110 and are swept from (base) material 10 into (collector) n-well 112 by the electric field that extends across the reverse-biased junction. The electrons in (collector) n-well 112 are then collected by n+ region 114.

A small number of the electrons injected into (base) material 110 recombine with holes in (base) material 110 and are lost. The holes lost to recombination with the injected electrons are replaced by holes injected into (base) material 110 by the broken-down reverse-biased junction and, as described below, by the collector current of a pnp transistor, thereby providing the base current.

The electrons that are injected and swept into n-well 112 also decrease the potential of n-well 112 in the region that lies adjacent to p+ region 116, and eventually forward bias the junction between p+ region 116 and n-well 112. When the decreased potential forward biases the junction between p+ region 116 and n-well 112, a pnp transistor formed from p+ region 116, n-well 112, and material 110, turns on.

When turned on, p+ emitter 116 injects holes into base 112. Most of the injected holes diffuse through (base) n-well 112 and are swept from (base) n-well 112 into (collector)

material 110 by the electric field that extends across the reverse-biased junction. The holes in (collector) material 110 are then collected by p+ region 124.

A small number of the holes injected into (base) n-well 112 recombine with electrons in (base) n-well 112 and are lost. The electrons lost to recombination with the injected holes are replaced by electrons flowing into n-well 112 as a result of the broken-down reverse-biased junction, and n-well 112 being the collector of the npn transistor. Thus, a small part of the npn collector current forms the base current of the pnp transistor.

Similarly, as noted above, the holes swept into (collector) material 110 also provide the base current holes necessary to compensate for the holes lost to recombination with the diffusing electrons injected by n+ (emitter) region 122. Thus, a small part of the pnp collector current forms the base current of the npn transistor.

Thus, n+ region 122 injects electrons that provide both the electrons for the collector current of the npn transistor as well as the electrons for the base current of the pnp transistor. At the same time, p+ region 116 injects holes that provide both the holes for the collector current of the pnp transistor as well as the holes for the base current of the npn transistor.

Thus, as mentioned above, one of the advantages of SCR 100 over other ESD protection devices, such as a grounded-gate MOS transistor, is the double injection provided by n+ region 122 and p+ region 116 of SCR 100. With double injection, SCR 100 provides current densities (after snapback) that are about ten times greater than the densities provided by a grounded-gate MOS device.

However, it is difficult to control the triggering voltage of a conventional SCR such as that illustrated in FIG. 1. Furthermore, it is always beneficial to seek ways of increasing the robustness of ESD protection devices such as SCRs. Also, conventional SCRs fail to address dual polarity voltage swings.

The present invention seeks to provide a SCR-like structure that is very robust, easily allows the process to provide for different triggering voltages of the structure, and is implementable in complementary structures to accommodate both positive and negative voltage swings.

SUMMARY OF THE INVENTION

The invention provides a vertical SCR-like structure in which the reverse biased junction extends substantially laterally.

Further, according to the invention, there is provided complementary SCR-like structures based on PNP and NPN BJTs.

Still further, according to the invention, there is provided, an ESD protection structure comprising a BJT-like structure with a buried layer, wherein the buried layer is at least partially replaced by a buried layer of the opposite conductivity type. Typically the opposite conductivity type buried layer is contacted through a sinker of said opposite conductivity type to define an emitter of a SCR-like structure. The buried layer may be a n-buried layer or p-buried layer, and the opposite conductivity type buried layer may be a p-buried layer or n-buried layer, respectively.

Still further, according to the invention, there is provided, an ESD protection structure for protecting against negative voltage swings, implementable using SOI (Silicon on insulator) or triple well process steps, comprising a PNP BJT-like structure with a p-buried layer, wherein the p-buried layer is at least partially replaced by a n-buried layer.

Typically the n-buried layer is contacted through a n-sinker to define an emitter of a SCR-like structure. The p-buried layer may be replaced altogether by the n-buried layer.

Still further, according to the invention, there is provided an adjustable ESD triggering structure, in which the triggering voltage can be adjusted. The structure includes a BJT-like structure having a first buried layer of a first conductivity type and a second buried layer of a second conductivity type partially replacing the first buried layer.

The invention also provides a method of adjusting the triggering voltage of an ESD triggering structure, comprising providing a BJT-like structure having a first buried layer of a first conductivity type and a second buried layer of a second conductivity type partially replacing the first buried layer, wherein the size of one or both of the buried layers is adjusted to provide a desired triggering voltage.

Still further, according to the invention, there is provided SCR-like triggering structure that includes a substantially vertically configured BJT structure, a SCR emitter, and a buried layer in contact with the SCR emitter. The SCR-like triggering structure may include a second buried layer in contact with the collector.

DETAILED DESCRIPTION OF THE INVENTION

Figure 1:
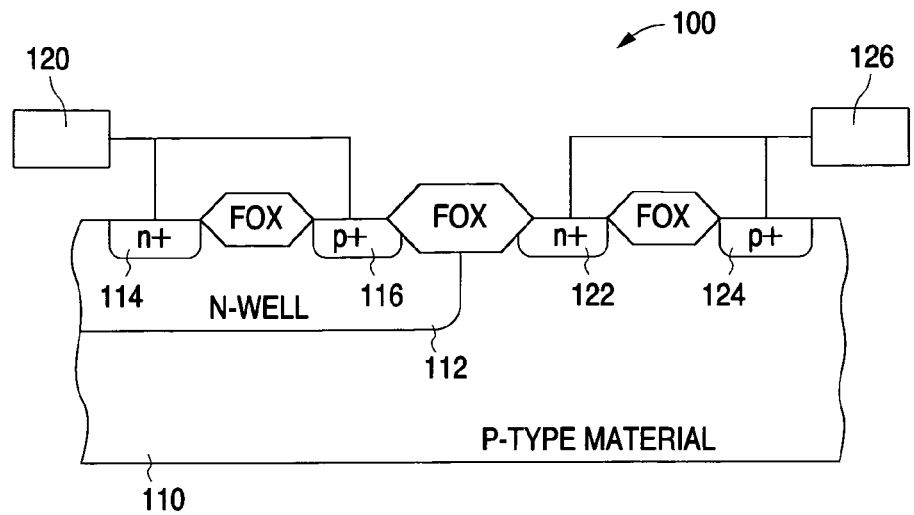
FIG. 1 is a cross-sectional view illustrating a conventional SCR.
Figure 2:
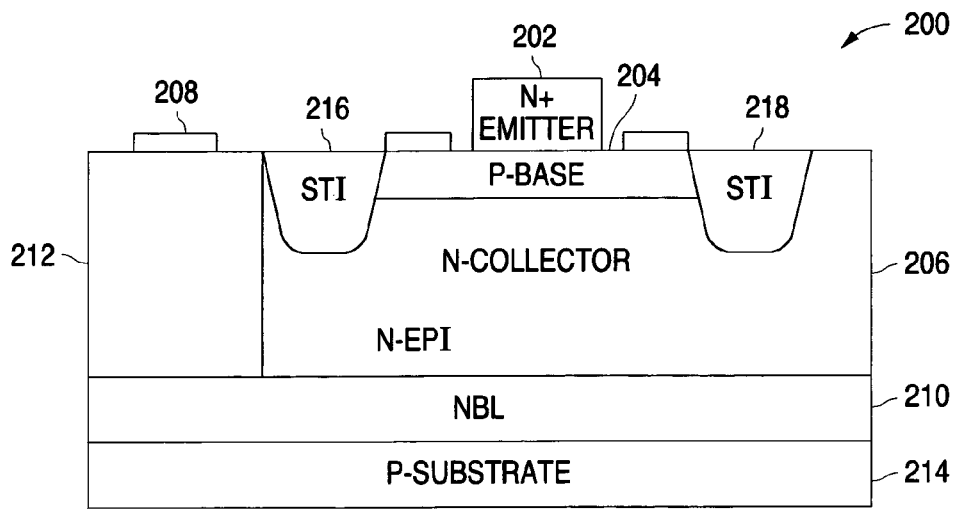
FIG. 2 is a cross-sectional view of a typical NPN BJT.

In order to better understand some of the concepts introduced in the present invention, it is useful to review the structure of a typical, prior art BJT, as illustrated in FIG. 2. FIG. 2 shows a NPN BJT structure 200 having a n+ emitter 202, a p-base 204, and a n-collector region 206 that are arranged in a vertical configuration. In order to contact the n-collector region 206 with corresponding collector contact 208, a n-buried layer (NBL) 210 is introduced that is contacted by the collector contact 208 through a n-sinker region 212. As, further, shown in FIG. 2, the NPN BJT is formed in a p-substrate 214, and the p-base 204 is isolated from the n-sinker 212 and adjacent structures by shallow trench isolation regions (STI) 216, 218.

The present invention provides a vertical SCR-like structure making use of some of the structural features found in a BJT, thereby achieving improved robustness to the ESD device and allowing complementary structures to be implemented based on NPN and PNP BJT structures. However, ESD devices are typically treated as so-called "free" devices (i.e., no extra mask or implant steps should be involved, thereby keeping down the original cost of the wafer). In the case of SOI, triple well, and some BiCMOS processes, SCR structures can readily be implemented using the standard process steps commonly found in SOI and triple well processes. It is, therefore, desirable to adopt these same process steps in implementing the complementary structures of the invention.

Figure 3:
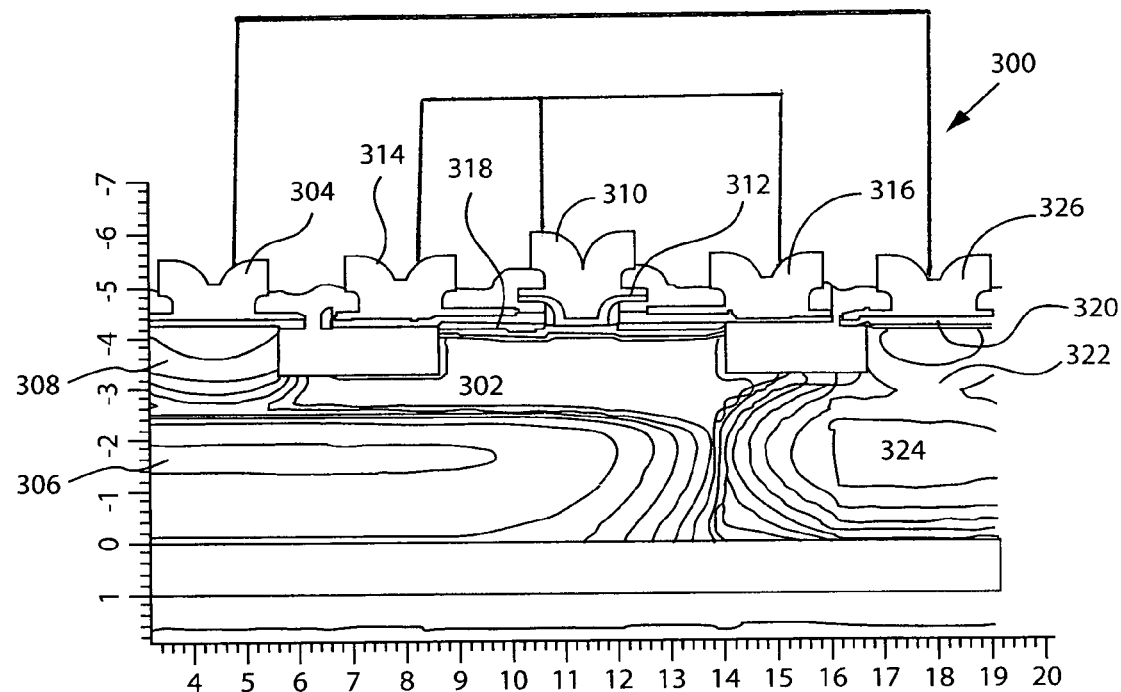
FIG. 3 is a cross-sectional view of one embodiment of the invention.

FIG. 3 shows one embodiment of a SCR-like structure of the invention, that makes use of a NPN BJT-like structure to achieve a vertical configuration SCR 300. As in the case of a conventional NPN structure, SCR 300 has a n-collector region 302 with a collector contact 304. A n-buried layer 306 is formed in the n-material of the collector and is contacted by the collector contact 304 through a n-sinker region 308. An emitter contact 310 contacts a lightly doped n-type region 312, and is flanked by two base contacts 314, 316, which contact a p-type base 318. The structure 300 thus defines a laterally extending reverse biased junction between the base 318 and collector 302 due to the vertical nature of the structure. However, the structure 300 takes on the characteristics of a SCR by including a p+ emitter 320 which extends downward in the form of a p-sinker 322 and contacts a p-buried layer 324 that partially replaces the n-buried layer 306. Thus the structure introduces the npnp configuration of a SCR, by virtue of the n-emitter 310 of the BJT structure, p-base 318 of the BJT structure, n-collector 308 of the BJT structure, and p+ emitter 320. The base contacts 314, 316 and emitter contact 310 are connected (not shown) using a first metal layer, thereby defining the cathode of the device. The contact 326 to the emitter 320, and the collector contact 304 are connected by a second metal layer (not shown) to define the anode of the device.

Figure 4:
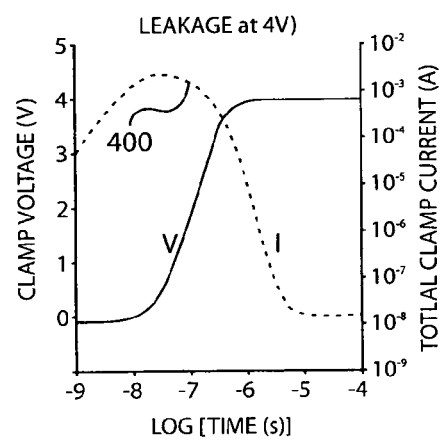
FIG. 4 shows voltage and leakage current curves over time for the device of FIG. 3.

According to TCAD experiments, the vertical configuration of the structure 300 results in a highly robust ESD structure with low leakage current as shown in the curve 400 of FIG. 4. FIG. 4 shows the leakage current and voltage curves for the structure of FIG. 3. The robustness may be attributed to the vertical nature of the structure, since the emitter 312 delivers the carriers right under the active region, i.e., to the laterally extending junction between base and collector.

Figure 5:
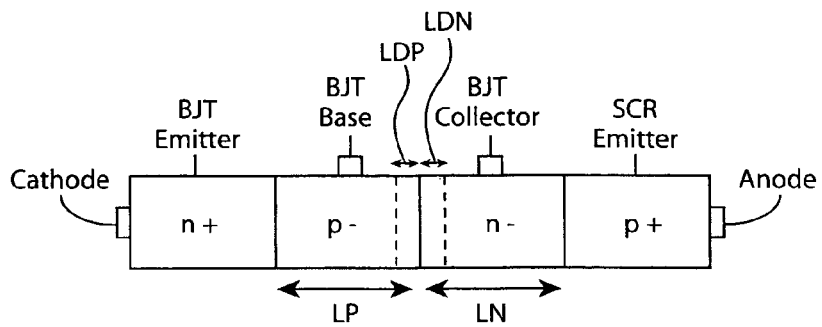
FIG. 5 is a simplistic block diagram of the structure of FIG. 3.

The configuration of the structure also allows the triggering voltage to be easily adjusted by adjusting the length of the p-buried layer 324 or n-buried layer 306. This is best understood with reference to the block representation of the npnp structure 300 shown in FIG. 5. When the length of the p-base region (LP) is much greater than the diffusion length of the carriers in the p-base region (LDP), and the length of the BJT collector (LN) is much greater than the diffusion length of the carriers in the BJT collector (LDN), the structure will function like a SCR. As LN or LP get smaller relative to their diffusion lengths LDN, LDP, respectively, the structure will operate more like a zener diode. Thus, by adjusting the size of the collector by adjusting the relative sizes of the n-buried layer 306 and p-buried layer 324, the triggering voltage of the structure can easily be adjusted.

Figure 6:
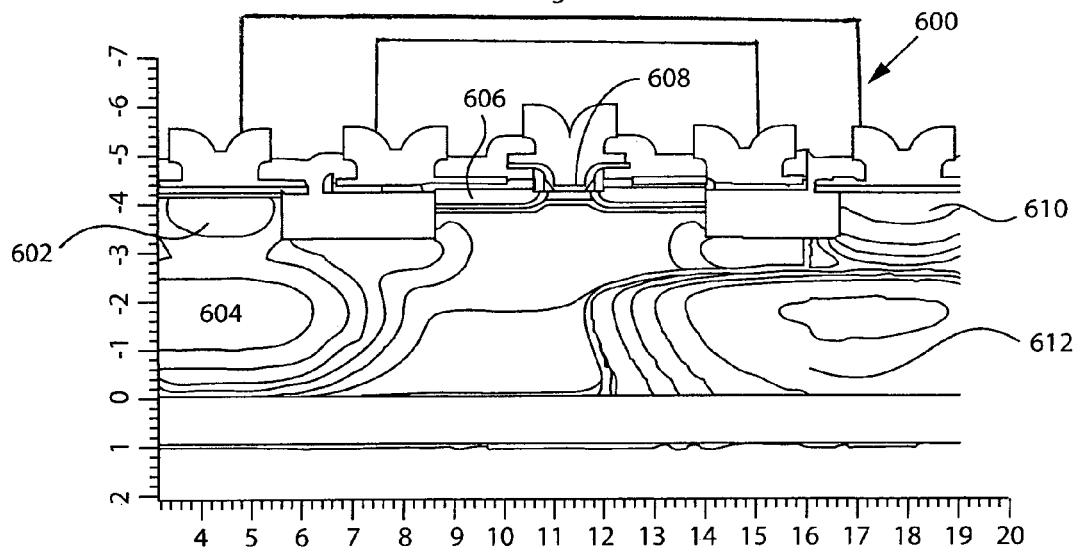
FIG. 6 is a cross-sectional view of another embodiment of the invention.

Another embodiment of the invention is shown in FIG. 6, which shows one embodiment of a PNP based SCR-like structure 600 of the invention. In this configuration, the polarities are reversed. Thus, the collector 602 is a p-collector and extends to a p-buried layer 604. The structure defines a PNP BJT by virtue of the p-collector 602, n-base 606, and p-emitter 608. Again, a SCR-emitter is introduced—in this case a n-emitter 610 that extends into a n-buried layer 612. The n-buried layer partially replaces the p-buried layer 604 of the collector. Thus the structure 600 provides a complementary structure to the structure 300, and provides ESD protection of negative polarity pulses.

Figure 7:
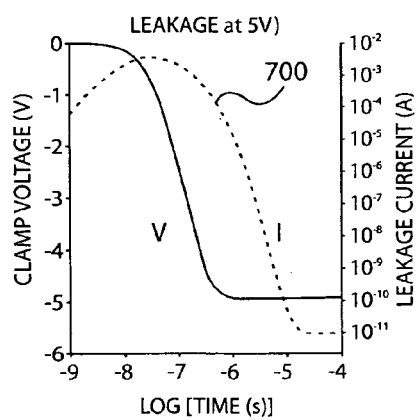
FIG. 7 shows voltage and leakage current curves over time for the device of FIG. 6.

FIG. 7 shows the leakage current (curve 700) of the structure 600, as determined by TCAD experiments, and once again illustrates the low leakage current produced by the vertical SCR structure of the invention.

Thus the present invention provides a new SCR-like structure that can readily be implemented using SOI or triple well process steps, and which is very robust and furthermore can be implemented in complementary form to provide both positive and negative ESD pulse protection.

While the invention was described with respect to specific embodiments, it will be appreciated that it can be implemented in other configurations without departing from the scope of the invention as defined by the claims.

What is claimed is:

1. A vertical SCR (silicon controlled rectifier) ESD (electrostatic discharge) protection structure, comprising
   a BJT structure that includes an emitter, a base, a collector, a collector contact, and a first buried layer of a first conductivity type contacting the collector and contacting the collector contact through a first sinker, and
   a second buried layer of opposite conductivity type to the first buried layer, and contacted through a second sinker, the emitter and base of the BJT being electrically connected to define one of the cathode or anode of the SCR, and the second sinker and collector contact of the BJT being electrically connected to define the other of the anode or cathode of the SCR.

2. An ESD protection structure of claim 1, wherein the first buried layer is a n-buried layer, and the second buried layer is a p-buried layer.

3. An ESD protection structure of claim 1, wherein the first buried layer is a p-buried layer, and the second buried layer is a n-buried layer.

4. A vertical SCR ESD protection structure for protecting against negative voltage swings, implementable using SOI (Silicon on insulator) or triple well process steps, comprising
   a PNP BJT structure that includes an emitter, a base, a collector with collector contact, and a p-buried layer contacting the collector through a p-type sinker, and
   an n-type sinker, and an n-buried layer substantially at the same depth as the p-buried layer and abutting the p-buried layer, the emitter being electrically connected to the base of the BJT to define an anode of the SCR, and the n-type sinker being electrically connected to the collector contact of the BJT to define a cathode of the SCR.

5. An adjustable ESD triggering structure, in which the triggering voltage can be adjusted, comprising
   a BJT structure that includes an emitter, a base, and a collector contacting a first buried layer through a sinker, the collector, sinker and first buried layer being of a first conductivity type, and
   a second buried layer and sinker of a second conductivity type electrically connected to the collector of the BJT, the second buried layer being arranged substantially at the same depth as the first buried layer, and abutting the first buried layer at selectable laterally defined locations.

6. A method of adjusting the triggering voltage of an ESD triggering structure, comprising
   providing a BJT structure having an emitter, a base, a collector, and a first sinker, and a first buried layer, the collector contacting the first buried layer through the first sinker, and wherein the collector, first sinker and first buried layer are of a first conductivity type; the emitter and base defining one of an anode or a cathode of a vertical SCR, and providing a second sinker, and a second buried layer of a second conductivity type and electrically connecting the second sinker and collector of the BJT to define the other of an anode or a cathode of the vertical SCR, the second buried layer being substantially at the same depth as the first buried layer, the method further comprising adjusting the size of one or both of the buried layers to provide a desired triggering voltage.

* * * * *